(12) United States Patent
Luo et al.

(10) Patent No.: US 8,946,071 B2
(45) Date of Patent: Feb. 3, 2015

(54) METHOD FOR MANUFACTURING SEMICONDUCTOR DEVICE

(75) Inventors: Jun Luo, Beijing (CN); Chao Zhao, Kessel-lo (BE); Huicai Zhong, San Jose, CA (US); Junfeng Li, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/364,950

(22) PCT Filed: Mar. 23, 2012

(86) PCT No.: PCT/CN2012/072985
§ 371 (c)(1),
(2), (4) Date: Jun. 12, 2014

(87) PCT Pub. No.: WO2013/086813
PCT Pub. Date: Jun. 20, 2013

(65) Prior Publication Data
US 2014/0357027 A1 Dec. 4, 2014

(30) Foreign Application Priority Data

Dec. 15, 2011 (CN) .......................... 2011 1 0419334

(51) Int. Cl.
*H01L 21/00* (2006.01)
*H01L 21/8238* (2006.01)
*H01L 21/84* (2006.01)
*H01L 29/417* (2006.01)
*H01L 29/45* (2006.01)

(52) U.S. Cl.
CPC ........ *H01L 21/823814* (2013.01); *H01L 21/84* (2013.01); *H01L 21/823878* (2013.01); *H01L 29/41725* (2013.01); *H01L 29/45* (2013.01)
USPC .......................................... 438/592; 438/682

(58) Field of Classification Search
USPC .......................................... 438/592, 682–683
See application file for complete search history.

(56) References Cited

U.S. PATENT DOCUMENTS

| 6,239,452 B1 * | 5/2001 | Xiang et al. ................... 257/57 |
| 6,294,434 B1 | 9/2001 | Tseng |
| 7,781,322 B2 * | 8/2010 | Ku et al. ....................... 438/592 |
| 2008/0124922 A1 | 5/2008 | Kawamura et al. |

FOREIGN PATENT DOCUMENTS

CN 101 197 286 6/2008

* cited by examiner

*Primary Examiner* — Richard Booth
(74) *Attorney, Agent, or Firm* — Fay Kaplun & Marcin, LLP

(57) ABSTRACT

The present invention discloses a method for manufacturing a semiconductor device, comprising: forming a gate stacked structure on a substrate; forming a source/drain region and a gate sidewall spacer at both sides of the gate stacked structure; depositing a Nickel-based metal layer at least in the source/drain region; performing a first annealing so that the silicon in the source/drain region reacts with the Nickel-based metal layer to form a Ni-rich phase of metal silicide; performing an ion implantation by implanting doping ions into the Ni-rich phase of metal silicide; performing a second annealing so that the Ni-rich phase metal silicide is transformed into a Nickel-based metal silicide, and meanwhile, forming a segregation region of the doping ions at an interface between the Nickel-based metal silicide and the source/drain region. The method according to the present invention performs the annealing after implanting the doping ions into the Ni-rich phase of metal silicide, thereby improving the solid solubility of the doping ions and forming a segregation region of highly concentrated doping ions, thus the SBH of the metal-semiconductor contact between the Nickel-based metal silica and the source/drain region is effectively reduced, the contact resistance is decreased, and the driving capability of the device is improved.

10 Claims, 4 Drawing Sheets

METHOD FOR MANUFACTURING SEMICONDUCTOR DEVICE

CROSS REFERENCE TO RELATED APPLICATIONS

This application is a national stage application, filed under 35 U.S.C. §371, of PCT Patent Application Serial No. PCT/CN2012/072985, filed on Mar. 23, 2012, which claimed priority to Chinese Patent Application Serial No. 201110419334.9, filed on Dec. 15, 2011, all of which are hereby incorporated by reference in their entirety

FIELD OF THE INVENTION

The present invention relates to a method for manufacturing a semiconductor device, and particularly, to a method for reducing the contact resistance of conventional highly doped source/drain MOSFET.

BACKGROUND OF THE INVENTION

The continuous increase of the IC integration level requires the device size to be constantly reduced in proportion. But sometimes the working voltage of the electric apparatus remains unchanged, and the actual electric field strength inside the MOS device continuously increases. The high electric field causes a series of reliability problems and degrades the device performance. For example, the parasitic series resistance between the source and drain regions of the MOSFET decreases the equivalent working voltage.

FIG. 1 illustrates an MOSFET in the prior art where the heavily doped source/drain has metal silicide. In which, a gate stacked structure 20 is formed on a substrate 10, the gate stacked structure 20 is composed of a gate dielectric layer 21 and a gate electrode 22. The gate stacked structure 20 is taken as a mask to perform a first source/drain ion implantation to form a lightly doped source/drain (LDD) region or a source/drain extension region 31. Next, isolation sidewall spacers 40 are formed on both sides of the gate stacked structure 20. The isolation sidewall spacer 40 is taken as a mask to perform a second source/drain ion implantation to form a heavily doped source/drain region 32. Next, through the self-aligned silicide procedure, a source/drain contact 50 of the metal silicide is formed on the heavily doped source/drain region 32 on each side of the isolation sidewall spacer 40. To be noted, In FIG. 1 and subsequent drawings, sometimes for the convenience of illustration, only the structures on the bulk silicon substrate are shown, but the present invention is still adaptive to the Silicon-on-Insulator (SOI) substrate. For example in FIGS. 4 to 8, the bulk silicon substrate is shown on the left side of the Shallow Trench Isolation (STI), and the SOI substrate is shown in the right side. The above two substrates are not directly connected to each other, and only shown for the convenience of illustration.

In order to be brief, only the left half structure of the MOSFET device is shown. In which, as illustrated in the drawing, the source/drain parasitic series resistance $R_{sd}$ is composed of four resistances connected in series, i.e., a resistance $R_{ov}$ of the overlapped part of the source/drain extension region 31 and the gate stacked structure 20, a resistance $R_{ext}$ of the source/drain extension region 31, a resistance $R_{dp}$ of the heavily doped source/drain region 32 below the source/drain contact 50, and a contact resistance $R_{csd}$ between the source/drain contact 50 and the heavily doped source/drain region 32, namely $R_{sd} = R_{csd} + R_{dp} + R_{ext} + R_{ov}$. With the continuous development of the technology node, the device size continuously decreases, while those resistances will increase with the reduction of the device size. In which the contact resistance $R_{csd}$ is especially important and plays an increasingly significant role. For example, in the device with a physical grid length less than 53 nm, the contact resistance $R_{csd}$ occupies more than 60% of the whole source/drain parasitic series resistance $R_{sd}$.

As shown in Table 1, according to the technology road map of 2010, the allowed maximum contact resistance of the Totally Depleted SOI (FDSOI) device will reach an order of $10^{-9}$ $\Omega\text{-cm}^2$, which brings a great challenge to the device design and manufacturing.

TABLE 1

| Year | 2015 | 2016 | 2017 | 2018 | 2019 | 2020 | 2021 |
|---|---|---|---|---|---|---|---|
| Technology node (nm) | 22 | 20 | 17.7 | 15.7 | 14.0 | 12.5 | 11.1 |
| physical grid length (nm) | 17 | 15 | 14 | 12.8 | 11.7 | 10.7 | 9.7 |
| maximum contact resistance of FDSOI ($\Omega*\text{cm}^2$) | $4.0 \times 10^{-8}$ | $2.0 \times 10^{-8}$ | $1.0 \times 10^{-8}$ | $8.0 \times 10^{-9}$ | $7.0 \times 10^{-9}$ | $6.0 \times 10^{-9}$ | $5.0 \times 10^{-9}$ |

As can be seen from the conductive mechanism between the metal and the semiconductor (e.g., n-type semiconductor), the contact resistance is a function between the height and width of the barrier. In case the semiconductor has a low doping concentration and a high Schottky Barrier Height (SBH), the conductive mechanism is the thermionic emission, and a Schottky contact occurs between the metal and the semiconductor. In case the semiconductor has an intermediate doping concentration and an intermediate SBH, the conductive mechanism is a combination of the thermionic and field emissions, and the contact between the metal and the semiconductor falls in between the Schottky contact and the ohmic contact. In case the semiconductor has a high doping concentration and a low SBH, the conductive mechanism is the field emission, and an ohmic contact occurs between the metal and the semiconductor; in that case, the electrons can easily go beyond the barrier, i.e., the contact resistance is low. It is clear that in order to reduce the contact resistance Rcsd, an ohmic contact must be produced between the metal and the semiconductor.

The magnitude of the contact resistance Rcsd depends on its resistivity ρc. Regarding the ohmic contact, ρc is proportional to the functions related to the SBH, the doping concentration and the effective carrier mass, as shown in the following mathematical expression (1):

$$\rho_c \propto e^{\left(\frac{2\phi_B}{\hbar}\sqrt{\frac{\varepsilon_s m^*}{N}}\right)} \quad (1)$$

In which, ρc is the resistivity of the contact resistance Rcsd, ΦB is the SBH, N is the source/drain doping concentration, and m* is the effective carrier mass.

As can be seen from mathematical expression (1), there are mainly three methods for decreasing the contact resistance Rcsd by reducing $\rho c$:

1. Increasing the source/drain region doping concentration N, e.g., increasing the implantation dose, expanding interface impurity distribution by laser annealing, improving the source/drain to increase the source/drain junction depth, etc.

2. Reducing the SBH $\Phi B$, e.g., using different metal silicide materials depending on different types (NMOS and PMOS) to reduce electron $\Phi B$ in the NMOS and cavity $\Phi B$ in the PMOS, respectively (i.e., the double-silicide process).

3. Reducing the effective carrier mass m* by a band gap engineering (or design), e.g., using narrow band gap materials such as Si1-xGex in the source/drain region.

However, the above three methods are very limited.

Regarding Method 1, due to the limited solid solubility of dopant or impurities in the silicon, the doping concentration N of the source/drain region cannot be continuously increased, i.e., N has a maximum value.

Regarding Method 2, due to different silicide materials, different layouts shall be made and different metal materials shall be deposited based on different types (NMOS and PMOS) when the MOS is manufactured. Thus the process complexity is greatly increased and the method cannot be applied in the actual production.

Regarding Method 3, it seems a simple process to just change the source/drain region material, but the doping concentration of impurities in Si1-xGex is lower than that in Si, i.e., although m* is reduced, N is also deceased, and there is no obvious reduction of $\rho c$ of the whole device.

Based on the prior art and by means of strict theoretical derivations and experimental verifications, the applicant employs a silicide as the doping source to reduce the SBH, so as to reduce the source/drain contact resistance using the above Method 2. Specifically, referring to FIGS. 1 to 3, the method may comprise: as illustrated in FIG. 1, a metal silicide 50 (usually Nickel-based metal silicide) is formed on the heavily doped source/drain region 32 having an LDD structure 31. As illustrated in FIG. 2, an ion implantation is performed for the metal silicide 50; for NMOS, the doping ions comprise N, P, As, O, S, Se, Te, F, Cl and combinations thereof, and for PMOS, the doping ions comprise B, Al, Ga, In and combinations thereof. As illustrated in FIG. 3, a driving annealing is performed so that the doping ions are segregated at the interface between the metal silicide and the source/drain region to form a segregation region 60 of the doping ions, which can effectively reduce the SBH, thereby decreasing resistivity of the contact resistance, and hence the device performance is improved.

However, the above method that reduces the SBH using the SADS still has the following deficiency: impurity ions implanted into the source/drain of the Nickel-based metal silicide have a poor solubility, and the implanted large quantity of ions cannot be solid-soluble in the Nickel-based metal silicide, thus the number of the doping ions available for reducing the SBH is not enough. By means of grain boundary diffusion, the implanted ions are segregate at the interface between the Nickel-based metal silicide and the silicon of the source/drain region to form a condensation region. But the temperature of the driving annealing is low and is not sufficient to completely activate the segregated impurities, thus the SBH is not obviously reduced. Therefore, the above conventional method is not enough to reduce the SBH to a level below 0.1 eV.

In summary, the existing MOSFET cannot effectively reduce the SBH, and then cannot effectively decrease the source/drain resistance RCSD while effectively improving the driving capability of the device. Thus the electric properties of the semiconductor device are seriously influenced, and it emergently requires a semiconductor device capable of effectively reducing the SBH and a method for manufacturing the same.

SUMMARY OF THE INVENTION

As mentioned above, an object of the present invention is to provide a method for manufacturing a semiconductor device capable of effectively reducing the SBH so as to decrease the contact resistance.

Thus the present invention provides a method for manufacturing a semiconductor device, comprising: forming a gate stacked structure on a substrate; forming a source/drain region and a gate sidewall spacer at both sides of the gate stacked structure; depositing a Nickel-based metal layer at least in the source/drain region; performing a first annealing so that the silicon in the source/drain region reacts with the Nickel-based metal layer to form a Ni-rich phase of metal silicide; performing an ion implantation by implanting doping ions into the Ni-rich phase of metal silicide; performing a second annealing so that the Ni-rich phase of metal silicide is transformed into a Nickel-based metal silicide, and meanwhile, forming a segregation region of the doping ions at an interface between the Nickel-based metal silicide and the source/drain region.

In which, the substrate comprises bulk silicon, SOI, and compound semiconductor.

In which, the Nickel-based metal layer comprises Ni, Ni—Pt, Ni—Co and Ni—Pt—Co.

In which, the Nickel-based metal layer has a thickness of about 1 to 100 nm.

In which, the Ni-rich phase metal silicide comprises Ni2Si, Ni3Si, Ni2PtSi, Ni3PtSi, Ni2CoSi, Ni3CoSi and Ni3PtCoSi.

In which, the first annealing is performed at 200 to 350☐ for 10 to 300 s.

In which, for pMOS, the doping ions comprise B, Al, Ga, In and combinations thereof, and for nMOS, the doping ions comprise N, P, As, O, S, Se, Te, F, Cl and combinations thereof.

In which, the second annealing is performed at 450 to 850☐.

In which, the Nickel-based metal silicide comprises NiSi, NiPtSi, NiCoSi2 and NiPtCoSi.

In which, the source/drain region comprises a lightly doped source/drain region and a heavily doped source/drain region.

The method for manufacturing the semiconductor device according to the present invention performs the annealing after implanting the doping ions into the Ni-rich phase of metal silicide, thereby improving the solid solubility of the doping ions and forming a segregation region of highly concentrated doping ions, thus the SBH of the metal-semiconductor contact between the Nickel-based metal silicide and the source/drain region is effectively reduced, the contact resistance is decreased, and the driving capability of the device is improved.

The above object of the present invention and other objects not listed herein are satisfied within the scope of the independent claim of the present application. The embodiments of the present invention are defined by the independent claim, and the specific features are defined by the dependent claims.

BRIEF DESCRIPTION OF THE DRAWINGS

The technical solutions of the present invention are detailedly described as follows with reference to the drawings, in which.

DETAILED DESCRIPTION OF THE EMBODIMENTS

The characteristics and technical effects of the technical solutions of the present invention are detailedly described as follows with reference to the drawings and in conjunction with the exemplary embodiments, in which a method for manufacturing a semiconductor device capable of effectively reducing the SBH so as to decrease the contact resistance is disclosed. To be noted, the similar reference signs denote the similar structures. The terms such as "first", "second", "upper" and "lower" occurring in the present application can be used to modify various device structures or manufacturing procedures. Those modifications do not imply the spatial, sequential or hierarchical relationships between the modified device structures or manufacturing procedures unless otherwise specified.

Figure 1:
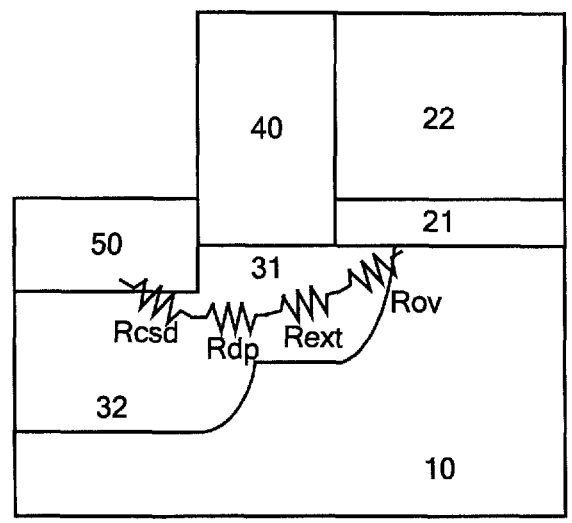
FIG. 1 is a cross-section view of the MOSFET in the prior art.
Figure 2:
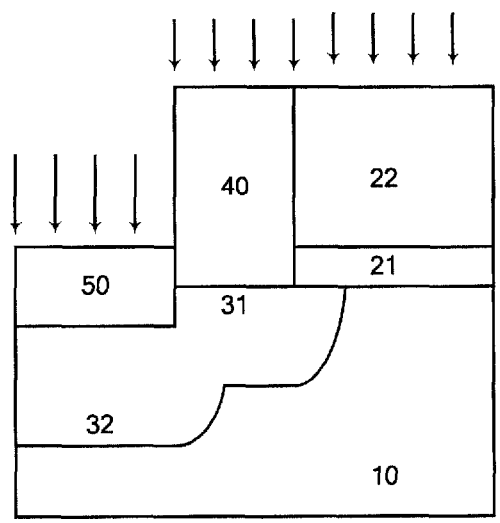
FIGS. 2 to 3 are cross-section views of the steps of a method for reducing the SBH in the prior art.
Figure 3:
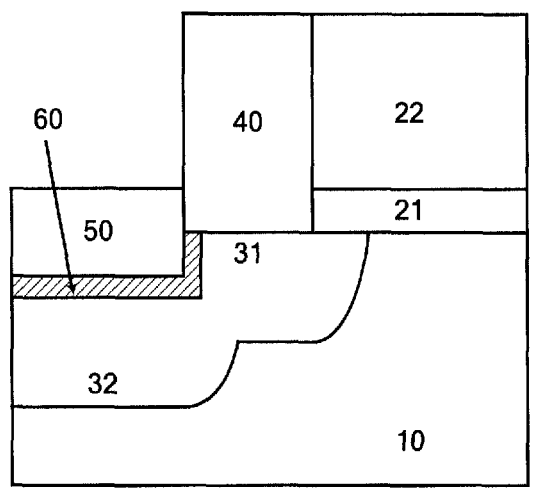
Figure 4:
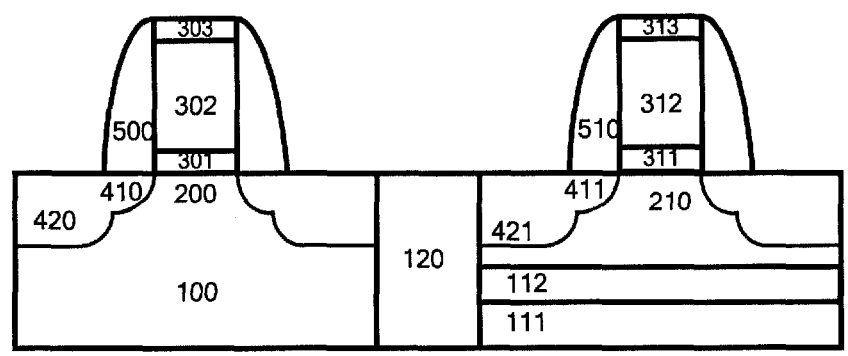
FIGS. 4 to 8 are cross-section views of the steps of a method for reducing the SBH according to the present invention.

Firstly as illustrated in FIG. 4, a substrate and a gate basic structure are formed.

For example, the isolation structure of an active region in a substrate may be formed firstly. A substrate 100/110 is provided, and regarding the embodiment of the present invention, the conventional semiconductor substrate can be used, such as the bulk silicon substrate 100, or other basic semiconductor or compound semiconductor like Ge, SiGe, GaAs, InP or Si:C and so on. According to the design requirement (e.g., p-type substrate or n-type substrate) known in the prior art, the substrate comprises various doped configurations. It may comprise an epitaxial layer or a Semiconductor-On-Insulator (SOI) structure, and may bear a stress to enhance the properties. The embodiment of the present invention preferably employs an SOI substrate 110 which for example comprises a silicon substrate 111, an oxygen-buried layer 112 on the silicon substrate 111, and a top silicon layer 113 on the oxygen-buried layer 112, wherein the thickness of the top silicon layer 113 may be less than or equal to 10 nm. For example, a sacrificial layer and an etching stop layer (not shown) made of oxide and/or nitride are deposited on the substrate 100/110; a photoresist is coated, then an exposure and a development are performed to remove the photoresist in the non-active region; an etching is performed to form a trench in the substrate, then the photoresist is removed; the whole substrate including the trench is filled with an oxide serving as an isolation medium, then a photolithography is performed again to remove the oxide in the active region, thus only the oxide in the previously formed trench is reserved; and finally an STI 120 is constructed. The filling material of the STI 120 may be silicon oxide or silicon oxynitride. Besides the STI, the LOCOS process may also be employed to form a thermal oxide isolation. For the small size device, the STI is preferably used. To be noted, although the drawing only illustrates one active region surrounded by two STIs and one type of MOSFETs (e.g., NMOS) therein, the present invention is adaptive to the MOSFETs of other MOS device (e.g., PMOS), CMOS device, or cell array.

A gate stacked structure 300/310 is formed on the substrate 100/110 having the STI 120 through a conventional method such as CVD, comprising firstly depositing a gate dielectric layer 301/311 that may be made of low-k silicon oxide, silicon oxynitride or silicon nitride, or a high-k material such as hafnium oxide, tantalum oxide, aluminum oxide, etc. A gate layer 302/312 is deposited on the gate dielectric layer 301/311, wherein the gate layer 302/312 may be made of doped polycrystalline silicon, or metal (e.g., Al, Ti, Ta, Mo, Cu etc.) or alloy and nitride thereof. Even when the gate layer 302/312 is used as the dummy gate for the gate-last process, it may be made of amorphous silicon, microcrystalline silicon, oxide (especially silicon dioxide), or laminations or mixtures thereof. A coverage layer 303/313 is deposited on the gate layer 302/312, which is usually made of nitride such as silicon nitride (SiN) for a mask layer subsequently to be etched or implanted. A gate stacked structure 300/310 composed of the overlapped gate dielectric layer 301/311, gate layer 302/312 and coverage layer 303/313 is formed using the conventional photolithographic mask etching process.

The gate stacked structure 300/310 is taken as a mask to perform a first source/drain ion implantation, so as to form a lightly doped source/drain (LDD) region or a source/drain extension region 410/411 with a shallow junction depth and a low concentration in the active region surrounded by the isolation structure STI 12 on each side of the gate stacked structure 300/310. For example, a material layer made of silicon nitride or silicon oxynitride is deposited on the surface of the whole device, and an anisotropic etching is performed to form a gate sidewall spacer 500/510. The gate sidewall spacer 500/510 is taken as a mask to perform a second source/drain ion implantation, so as to form a heavily doped source/drain region 420/421 with a deep junction depth and a high concentration in the active region on each side of the gate sidewall spacer 500/510. In which, the channel region 200/210 between the heavily doped source/drain region 420/421 has a length less than or equal to 20 nm, i.e., the device is a sub-20 nm short channel MOSFET. To be noted, in order to form a Ni-rich phase of metal silicide later on, the source/drain region is preferably made of a silicic material, such as bulk silicon, SOI, GeSi, SiC, etc. The source/drain region may be formed through a direct implantation into the silicic substrate as mentioned above, or by forming a source/drain groove through etching, depositing a silicic source/drain region material therein, and implanting source/drain doping ions into the silicic source/drain region.

Figure 5:
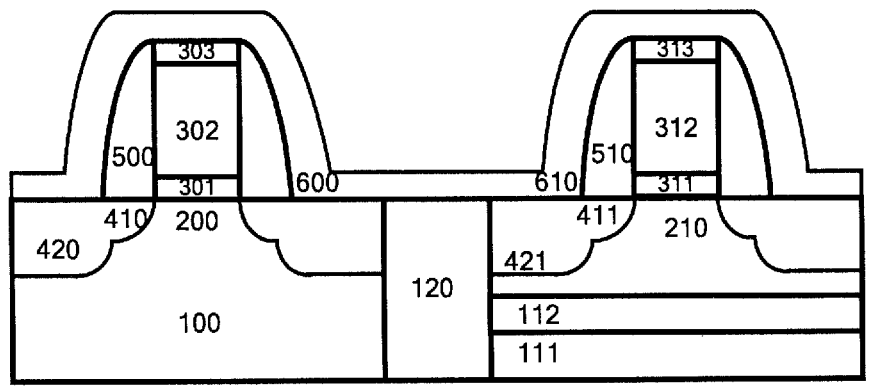

Secondly, a metal layer is deposited. As illustrated in FIG. 5, a metal layer 600/610 for forming the metal silicide is deposited on the whole basic structure, so as to cover the source/drain region, the gate structure and the gate sidewall spacer. The thin metal layer is preferably made of Nickel-based metal/alloy, such as Ni, Ni—Pt (the molar content of Pt is less than or equal to 10%), Ni—Co (the molar content of Co is less than or equal to 10%), Ni—Pt—Co (the sum of the molar contents of Pt and Co is less than or equal to 10%), etc. The thin metal layer has a thickness of about 1 to 100 nm.

Figure 6:
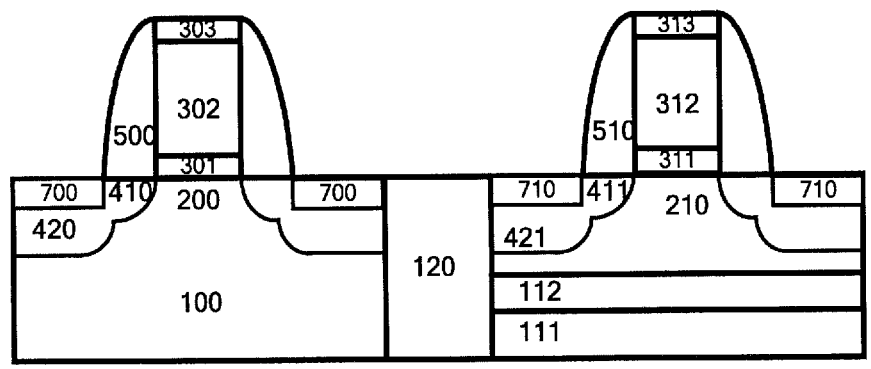

Next, referring to FIG. 6, a first annealing is performed to form a Ni-rich phase of silicide. For example, the first annealing may be performed at 200 to 350□ for 10 to 300 s, so that the deposited metal layer 600/610 reacts with the silicon in the source/drain region (particularly the heavily doped source/drain region 420/421) to generate a Ni-rich phase of silicide 700/710. The so called Ni-rich phase of silicide means that the content of the Nickel-based metal (atomic number) in the silicide is higher than that of Si, and it specifically may include Ni2Si, Ni3Si, Ni2PtSi, Ni3PtSi, Ni2CoSi, Ni3CoSi, Ni3PtCoSi, etc. To be noted, in this step, the Nickel-based metal does not completely consume the silicon in the heavily doped source/drain region 420/421, thus the formed Ni-rich phase of silicide 700/710 is basically located in the heavily doped source/drain region, i.e., the top surface thereof is flush with that of the substrate or even higher by not more than 10 nm, and the bottom surface thereof is located in the heavily doped source/drain region and higher than that of the heavily doped source/drain region.

Figure 7:
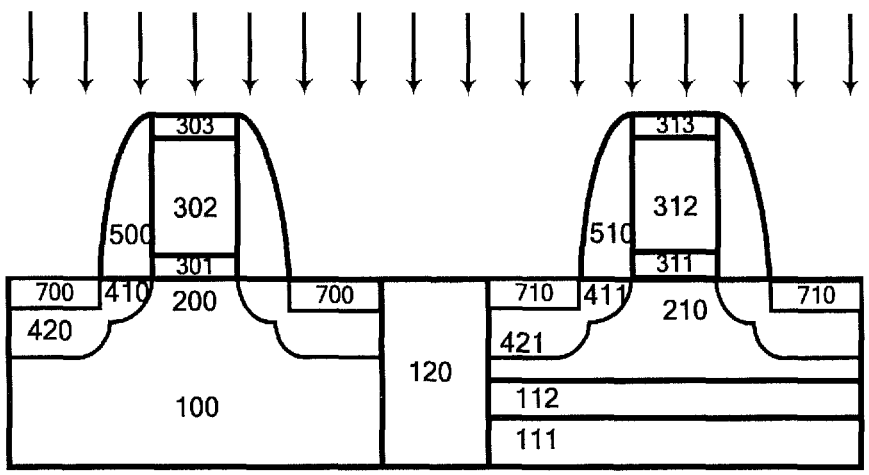

Next, referring to FIG. 7, the unreacted metal layer 600/610 is stripped, and an ion implantation is performed for the Ni-rich phase of silicide 700/710 with a dose of about $1\times10^{14}$ cm$^{-2}$ to $1\times10^{16}$ cm$^{-2}$. For pMOS, the doping ions may be boron (B), aluminum (Al), gallium (Ga), indium (In), etc. or combinations thereof. For nMOS, the doping ions may be nitrogen (N), phosphorus (P), arsenic (As), oxygen (O), sulphur (S), selenium (Se), tellurium (Te), fluorine (F), chlorine (Cl), etc. or combinations thereof. The Ni-rich phase of silicide may be impaired during the ion implantation, thus the implantation energy can not be too high (e.g., lower than 100 KeV) and should better be sufficiently low (e.g., 20 to 50 KeV) to ensure that most of the implanted doping ions are restricted within the Ni-rich phase of silicide. Particularly, the ion implantation in the present invention is performed before the Nickel-based metal silicide is finally formed, and the implanted ions have a high solid solubility in the Ni-rich phase of silicide, thus the ion concentration in the segregation region of subsequent doping ions can be increased, so as to effectively reduce the SBH.

Figure 8:
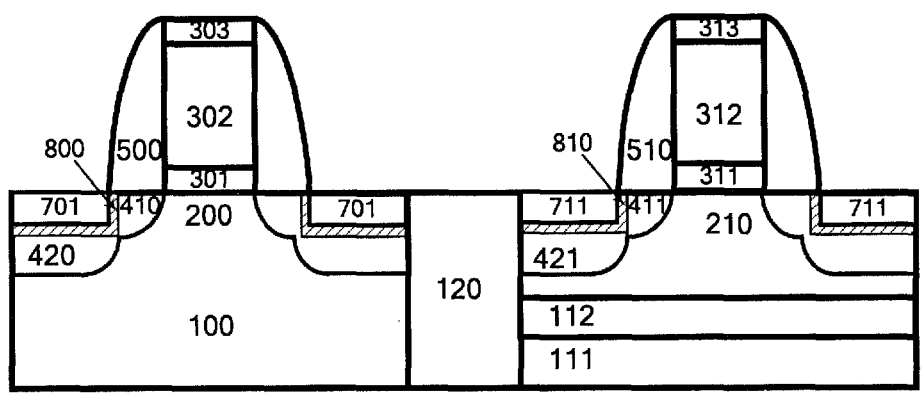

Finally, referring to FIG. 8, a second annealing is performed. The second annealing is performed at 450 to 850□ for a period such as 10 to 600 s to transform the Ni-rich phase of silicide 700/710 into a Nickel-based metal silicide 701/711 of a low resistance (specifically including NiSi, NiPtSi, NiCoSi2, NiPtCoSi, etc.) to decrease the source/drain contact resistance of the device. Meanwhile, the doping ions are driven to form a segregation region 800/810 of the doping ions at the interface between the Nickel-based metal silicide 701/711 and the source/drain region. Specifically, the segregation region 800/810 of the doping ions is located at not only the lower surface of the Nickel-based metal silicide 701/711, but also the lateral surface of the source/drain region 701/711. The segregation region 800/810 of the doping ions is activated after the second driving annealing at a high temperature, so as to effectively reduce the SBH between the Nickel-based metal silicide 701/711 and source/drain region, decrease the contact resistance while improving the driving capability, thereby greatly improving the driving capability of the device.

Next, similar to the conventional MOSFET process, the subsequent device structures are formed. For example, an interlayer dielectric layer (not shown) may be deposited and planarized; a contact via hole may be formed by photolithography/etching; a contact cushion layer and a metal contact material may be deposited and CMP-planarized to form the final source/drain contact plug (not shown). The contact cushion layer may be made of, but not limited to, Ti, Ta, TiN, TaN and combinations thereof. The metal contact material include, but not limited to, W, Cu, TiAl, Al and combinations thereof. In case the gate layer is the dummy gate, i.e., the gate-last process is adopted, firstly the dummy gate may be removed by etching, then a high-k gate dielectric material and a metal gate material may be deposited successively and planarized, after the interlayer dielectric layer is formed and before the contact via hole is formed.

The method for manufacturing the semiconductor device according to the present invention performs the annealing after implanting the doping ions into the Ni-rich phase of metal silicide, thereby improving the solid solubility of the doping ions and forming a segregation region of highly concentrated doping ions, thus the SBH of the metal-semiconductor contact between the Nickel-based metal silicide and the source/drain region is effectively reduced, the contact resistance is decreased, and the driving capability of the device is improved.

Although the present invention has been described with reference to one or more exemplary embodiments, a person skilled in the art shall be appreciated that various suitable changes and equivalent measures can be made to the device structure without deviating from the scope of the present invention. In addition, many modifications suitable to particular situations or materials may be made under the disclosed teaching without deviating from the scope of the present invention. Therefore, the present invention is not limited to the specific embodiments disclosed as the optimum embodiments for implementing the present invention, and the disclosed device structure and the method for manufacturing the same include all the embodiments falling within the scope of the present invention.

What is claimed is:

1. A method for manufacturing a semiconductor device, comprising:
    forming a gate stacked structure on a substrate;
    forming a source/drain region and a gate sidewall spacer at both sides of the gate stacked structure;
    depositing a Nickel-based metal layer at least in the source/drain region;
    performing a first annealing so that the silicon in the source/drain region reacts with the Nickel-based metal layer to form a Ni-rich phase of metal silicide;
    performing an ion implantation by implanting doping ions into the Ni-rich phase of metal silicide; and
    performing a second annealing so that the Ni-rich phase of metal silicide is transformed into a Nickel-based metal silicide, and meanwhile, forming a segregation region of the doping ions at an interface between the Nickel-based metal silicide and the source/drain region.

2. The method for manufacturing the semiconductor device according to claim 1, wherein the substrate comprises bulk silicon, SOI, and compound semiconductor.

3. The method for manufacturing the semiconductor device according to claim 1, wherein the Nickel-based metal layer comprises Ni, Ni—Pt, Ni—Co and Ni—Pt—Co.

4. The method for manufacturing the semiconductor device according to claim 1, wherein the Nickel-based metal layer has a thickness of about 1 to 100 nm.

5. The method for manufacturing the semiconductor device according to claim 1, wherein the Ni-rich phase of metal silicide comprises $Ni_2Si$, $Ni_3Si$, $Ni_2PtSi$, $Ni_3PtSi$, $Ni_2CoSi$, $Ni_3CoSi$ and $Ni_3PtCoSi$.

6. The method for manufacturing the semiconductor device according to claim 1, wherein the first annealing is performed at 200 to 350□ for 10 to 300 s.

7. The method for manufacturing the semiconductor device according to claim 1, wherein for pMOS, the doping ions comprise B, Al, Ga, In and combinations thereof, and for nMOS, the doping ions comprise N, P, As, O, S, Se, Te, F, Cl and combinations thereof.

8. The method for manufacturing the semiconductor device according to claim 1, wherein the second annealing is performed at 450 to 850□.

9. The method for manufacturing the semiconductor device according to claim 1, wherein the Nickel-based metal silicide comprises NiSi, NiPtSi, $NiCoSi_2$ and NiPtCoSi.

10. The method for manufacturing the semiconductor device according to claim 1, wherein the source/drain region comprises a lightly doped source/drain region and a heavily doped source/drain region.

* * * * *